United States Patent [19]

Hirama

[11] Patent Number: 5,199,053
[45] Date of Patent: Mar. 30, 1993

[54] CHARGE TRANSFER DEVICE OUTPUT
[75] Inventor: Masahide Hirama, Kanagawa, Japan
[73] Assignee: Sony Corporation, Tokyo, Japan
[21] Appl. No.: 911,936
[22] Filed: Jul. 10, 1992
[30] Foreign Application Priority Data Jul. 12, 1991 [JP] Japan .................................. 3-172633
Jul. 12, 1991 [JP] Japan .................................. 3-172634

[51] Int. Cl.[5] ....................... G11C 19/28; H01L 29/78
[52] U.S. Cl. ....................................... 377/60; 257/239
[58] Field of Search ....................... 357/24; 377/57–63

[56] References Cited

U.S. PATENT DOCUMENTS

| 4,092,549 | 5/1978 | Prince | 377/60 |
| 4,811,371 | 3/1989 | Tower | 377/60 |
| 4,974,240 | 11/1990 | Suzuki et al. | 377/60 |
| 5,073,908 | 12/1991 | Cazaux | 377/60 |

Primary Examiner—Gene M. Munson
Attorney, Agent, or Firm—Hill, Steadman & Simpson

[57] ABSTRACT

In a CCD element, the influence of a parasitic capacitance existing between a floating diffusion region and a reset gate section of an output section is suppressed to increase sensitivity. In a CCD element in which a floating diffusion region (7) is connected to the final stage of a charge transfer register (1) having a CCD structure through a horizontal output gate section (5) and a reset gate section (11) is disposed between the floating diffusion region (7) and a reset drain region (10), an output gate pulse ($\phi_{HOG}$) having an anti-phase of a reset pulse ($\phi_{RG}$) applied to the reset gate section (11) is applied to the horizontal output gate section (5). Further, an output waveform in a signal period in a CCD linear sensor can be made flat and a signal level difference between odd-numbered and even-numbered pixels can be improved. In a CCD linear sensor comprising a photo sensing region formed of a plurality of photo sensing elements (pixels), first and second horizontal transfer registers disposed at both sides of the photo sensing region through read-out gate sections, a floating diffusion region for alternately detecting signal charges transferred thereto from the first and second horizontal transfer registers as output signals and a reset gate section, a transfer section of the final stage portion of the first and second horizontal transfer registers is separated and phases of drive pulses ($\phi H_1'$), ($\phi H_2'$) applied to the transfer section of the final stage portion are shifted from those of drive pulses ($\phi H_1$), ($\phi H_2$) applied to the preceding transfer section, whereby a noise component (36) is superimposed upon the output waveform of ON period ($T_R$) of the reset gate section.

15 Claims, 11 Drawing Sheets

Time Point t11

Time Point t12

Time Point t13

Time Point t14

CHARGE TRANSFER DEVICE OUTPUT

BACKGROUND OF THE INVENTION

1. Field of the Invention

The present invention relates to CCD (charge coupled device) linear sensor, CCD imaging devices such as a CCD linear sensor and CCD elements such as other devices utilizing CCDs or the like.

2. Description of the Prior Art

FIG. 1 of the accompanying drawings shows a structure of a final stage portion of a horizontal transfer register of a conventional CCD imaging device and an output section thereof.

Referring to FIG. 1, a horizontal transfer register 1 has a plurality of arrays of transfer sections 4 each composed of transfer electrodes, i.e., a storage electrode 3S and a transfer electrode 3T formed on a major surface of a semiconductor substrate 2 via an insulating layer, and transfers signal charges in the horizontal direction by means of two-phase drive pulses $\phi H_1$ and $\phi H_2$ (see FIGS. 2A and 2B). The transfer section 4 at the final stage of the horizontal transfer register 1 is connected to a floating diffusion region 7 via a horizontal output gate section 5 to which there is applied a fixed gate voltage $V_{HOG}$. The signal charge from the horizontal transfer register 1 is transferred to the floating diffusion region 7, in which it is converted in the form of charge to voltage and then output from an output amplifier 8. In an output section 9, a reset gate section 11 to which a reset pulse $\phi RG$ (see FIG. 2C) is applied is formed between the floating diffusion region 7 and a reset drain region 10 in order to drain out the signal charge transferred to the floating diffusion region 7 to the reset drain region 10 to which there is applied a predetermined voltage $V_{RD}$ (see FIG. 2D).

In the output section 9 of FIG. 1, as shown by a waveform of a potential on the floating diffusion region 7 in FIG. 2D, when the reset gate section 11 is turned on (when the reset pulse $\phi RG$ is high in level), a potential $V_{FD}$ of the floating diffusion region 7 becomes equal to a potential $V_{RD}$ of the reset drain region 10 ($V_{FD}=V_{RD}$). However, a parasitic capacitance $C_1$ exists between the floating diffusion region 7 and the reset gate section 11 so that, after the reset gate section 11 is turned off, the potential $V_{FD}$ of the floating diffusion region 7 does not equal to the potential $V_{RD}$ of the reset drain region 10 due to a capacitive coupling of the parasitic capacitance $C_1$ and becomes lower than the potential $V_{RD}$ ($V_{FD}<V_{RD}$). Considering this phenomenon from a waveform of a CCD output shown in FIG. 2E, after the reset gate section 11 is turned off, the CCD output becomes a potential (i.e., field-through potential) b which is lower than a reference potential (i.e., reset potential) a. A difference between the reference potential a and the field-through potential b is rendered a so-called coupling amount $A_1$ which is caused by the parasitic capacitance $C_1$.

It is desirable that the parasitic capacitance $C_1$ is reduced in proportional to a capacity associated with the floating diffusion region 7 as the CCD imaging device is increased in sensitivity. More specifically, if the parasitic capacitance $C_1$ is not reduced, then the coupling amount $A_1$ is relatively increased, resulting in a dynamic range of a signal component being reduced. As shown in a diagram of potentials in FIG. 3, the potential in the floating diffusion region 7 after the reset gate section 11 is turned off is lowered (shown by a solid line) from the potential $V_{RD}$ (shown by a dashed line) of the reset drain region 10. As a result, signal charges are difficult to be transferred to the floating diffusion region 7 and the amount of signal charges to be transferred is reduced. A potential difference $B_1$ in FIG. 3 corresponds to the coupling amount $A_1$ in the waveform of the CCD output.

Furthermore, in order to obtain a higher resolution, a CCD linear sensor is arranged such that signal charges of odd-numbered photo sensing elements (pixels) and even-numbered photo sensing elements (pixels) are transferred to two charge transfer registers in a divided fashion and then output from the final stage in the mixed form.

As shown in FIG. 4, first and second horizontal transfer registers 24 and 25 each being formed of a CCD are disposed on respective sides of a photo sensing region 21 having an array composed of a plurality of photo sensing elements (pixels) S ($S_1$, $S_2$, $S_3$, . . . ) through read-out gate sections 22 and 23. Signal charges of the odd-numbered photo sensing elements $S_1$, $S_3$, $S_5$, . . . are read out to the first horizontal transfer register 24 and signal charges of the even-numbered photo sensing elements $S_2$, $S_4$, $S_6$, . . . are read out to the second horizontal transfer register 25. Then, signal charges are transferred in one direction by two-phase drive pulses $\phi H_1$, $\phi H_2$ and $\phi H_1'$, $\phi H_2'$ shown in FIGS. 5A and 5B, respectively. Transfer sections $HR_1$, $HR_2$ of the final stages are applied with independent drive pulses $\phi H_1'$, $\phi H_2'$ which are synchronized with the drive pulses $\phi H_1$, $\phi H_2$ supplied to preceding transfer sections $HR_1$, $HR_2$. The transfer sections $HR_1$, $HR_2$ provided at the final stages of the first and second horizontal transfer registers 24, 25 are connected to a common floating diffusion region 27 via a common horizontal output gate section 26 to which there is applied a gate voltage $V_{HOG}$. Then, signal charges read out from the even-numbered and even-numbered photo sensing elements and transferred by the first and second horizontal transfer registers 24, 25 are added together by the floating diffusion region 27, that is, the odd-numbered and even-numbered signal charges are alternately transferred to the common floating diffusion region 27, in which they are converted in the form of charge to voltage and then signals corresponding to odd-numbered and even-numbered pixels are sequentially and alternately output from an output amplifier 28 as shown by a waveform of a CCD output in FIG. 5D. In this output section, the signal charges transferred to the floating diffusion region 27 are discharged to a reset drain region 30 through a reset gate section 29 by a reset pulse $\phi RG$ which is supplied thereto and whose frequency is twice as high as those of the two-phase drive pulses $\phi H_1$, $\phi H_2$ and $\phi H_1'$, $\phi H_2'$ as shown in FIG. 5C.

In the CCD linear sensor, large capacitances of the first and second transfer sections $HR_1$, $HR_2$ in the horizontal transfer registers 24, 25 are driven by the drive pulses $\phi H_1$, $\phi H_2$ so that noise components caused by such capacitances are superimposed upon the output signal. Consequently, the waveform of the CCD output during the signal period, for example, is fluctuated. Further, when signal charges are read out by the two horizontal transfer registers 24 and 25, a difference known as "DC level difference" occurs between the signal level of the odd-numbered pixel (photo sensing element) and that of the even-numbered pixel (photo sensing element).

In the output section, the floating diffusion region 27 is formed within a well region and the well region is interconnected to the ground. In that event, the capacitance of the transfer sections $HR_1$, $HR_2$ is large so that, when the horizontal transfer registers 24, 25 are driven by the two-phase drive pulses $\phi H_1$, $\phi H_2$, a well region potential (so-called reference potential) Vo is momentarily fluctuated at negative-going edges $t_1$, $t_2$, $t_3$, ... of the drive pulse $\phi H_1$ or $\phi H_2$ which transfers the signal charges to the floating diffusion region 27 as shown in FIG. 5, to thereby produce a fluctuated component 15. Consequently, a noise component 16 is superimposed upon the output signal on the basis of this fluctuated component 15. Thus, the waveform during the signal period is not flat. Further, since the capacitance of the first transfer section $HR_1$ is different from that of the second transfer section $HR_2$, the noise component 16 is changed, thereby resulting in a difference (so-called DC level difference) being produced in the signal level of the odd-numbered pixel and that of the even-numbered pixel.

This signal level difference becomes conspicuous because the resolution of the CCD linear sensor is increased more and more. Therefore, each of the pixels must be corrected, which is very cumbersome in the prior art.

OBJECTS AND SUMMARY OF THE INVENTION

Therefore, it is an object of the present invention to provide an improved CCD imaging device in which the aforesaid shortcomings and disadvantages encountered with the prior art can be eliminated.

More specifically, it is an object of the present invention to provide a CCD imaging device in which a coupling amount caused by a capacitance between a reset gate section and a floating diffusion region can be reduced.

Another object of the present invention is to provide a CCD imaging device which can be improved in sensitivity.

A further object of the present invention is to provide a CCD imaging device in which a waveform in a signal period can be made flat.

Yet a further object of the present invention is to provide a CCD imaging device in which a difference between signal levels of pixels can be improved.

Still a further object of the present invention is to provide a CCD imaging device which can produce image quality of high resolution without correcting a black signal.

As a first aspect of the present invention, a charge transfer device formed on a semiconductor substrate is comprised of a charge detecting section including an electrically floating diffusion region, a floating diffusion amplifier connected to the floating diffusion region, and a transistor responsive to a reset pulse voltage signal for resetting the floating diffusion region to a predetermined potential, the transistor comprising the floating diffusion region, a drain diffusion region formed in the substrate, a gate electrode connected to a source of the pule voltage signal, and a channel formed on the substrate, the channel extending between the floating diffusion region and the drain diffusion region, and charge transfer section for transferring charges to the charge detecting section, a the charge transfer section including a channel formed on the substrate, a plurality of gate electrodes insulated from the channel, and an output gate electrode formed on an end of the charge transfer section, the plurality of gate electrodes being responsive to a driving pulse voltage signal, wherein the driving pulse voltage signal having a specific phase so that a noise generated by a voltage shift of the driving pulse voltage signal overlaps on an output signal corresponding to a reset period.

As a second aspect of the present invention, a solid state linear imaging device formed on a semiconductor substrate is comprised of a plurality of photo sensing elements receiving a light and producing a charge signal corresponding to the amount of light, and a charge transfer section for receiving the charge signal from the photo sensing elements and transferring the charge signal to a charge detecting section, the charge detecting section including an electrically floating diffusion region, a floating diffusion amplifier connected to the floating diffusion region, and a transistor responsive to a reset pulse voltage signal for resetting the floating diffusion region to a predetermined potential, the transistor comprising the floating diffusion region, a drain diffusion region formed in the substrate, a gate electrode connected to a source of the pulse voltage signal, and a channel formed on the substrate, the channel extending between the floating diffusion region and the drain diffusion region, the charge transfer section including a channel formed on the substrate, a plurality of gate electrodes insulated from the channel, and an output gate electrode formed on an end of the charge transfer section, the plurality of gate electrodes being responsive to a driving pulse voltage signal, and the driving pulse voltage signal having a specific phase so that a noise generated by a voltage shift of the driving pulse voltage signal overlaps on an output signal corresponding to a reset period.

According to a third aspect of the present invention, there is provided a charge transfer device formed on a semiconductor body which comprises of a charge detecting section including an electrically floating diffusion region, a floating diffusion amplifier connected to the floating diffusion region and a transistor responsive to a reset pulse voltage signal for resetting the floating diffusion region to a predetermined potential, the transistor comprising the floating diffusion region, a drain diffusion region formed in a substrate, a gate electrode connected to a source of the reset pulse voltage signal, and a channel formed on the substrate, the channel extending between the floating diffusion region and the drain diffusion region; and a charge transfer section for transferring charges to a charge detecting section, the charge transfer section including a channel formed on the substrate, a plurality of gate electrodes insulated from the channel, and an output gate electrode formed on an end of the charge transfer section, the gate electrodes consisting of a first portion responsive to a first driving pulse voltage signal and a second portion responsive to a second driving pulse voltage signal, the second portion being adjacent to the output gate electrode, wherein the first driving pulse voltage signal has a specific phase so that a noise generated by a voltage shift of the first driving pulse voltage signal overlaps on an output corresponding to a reset period.

According to a fourth aspect of the present invention, there is provided a solid state linear imaging device formed on a semiconductor substrate which comprises a plurality of photo sensing elements receiving a light and producing a charge signal corresponding to the amount of light, and a charge transfer section for receiving the charge signal from the photo sensing elements and transferring the charge signal to a charge detecting section, the charge detecting section including an electrically floating diffusion region, a floating diffusion amplifier connected to the floating diffusion region, and a transistor responsive to a reset pulse voltage signal for resetting the floating diffusion region to a predetermined potential, the transistor comprising the floating diffusion region, a drain diffusion region formed in the substrate, a gate electrode connected to a source of the reset pulse voltage signal, and a channel formed on the substrate, the channel extending between the floating diffusion region and the drain diffusion region, the charge transfer section including a channel formed on the substrate, a plurality of gate electrodes insulated from the channel, and an output gate electrode formed on an end of the charge transfer section, the gate electrodes consisting of a first portion responsive to a first driving pulse voltage signal and a second portion responsive to a second driving pulse voltage signal, the second portion being adjacent to the output gate electrode, wherein the first driving pulse voltage signal has a specific phase so that a noise generated by a voltage shift of the first driving pulse voltage signal overlaps on an output signal corresponding to a reset period.

According to a fifth aspect of the present invention, there is provided a charge transfer device formed on a semiconductor body which comprises a charge detecting section including an electrically floating diffusion region, a floating diffusion amplifier connected to the floating diffusion region and a transistor responsive to a reset pulse voltage signal for resetting the floating diffusion region to a predetermined potential, the transistor comprising the floating diffusion region, a drain diffusion region formed in a substrate, a gate electrode connected to a source of the pulse voltage signal, and a channel formed on the substrate, the channel extending between the floating diffusion region and the drain diffusion region, and a charge transfer section for transferring charges to a charge detecting section, the charge transfer section including a channel formed on the substrate, a plurality of gate electrodes insulated from the channel, and an output gate electrode formed on an end of the charge transfer section, the output gate electrode being responsive to an output gate pulse voltage signal, and the output gate pulse voltage signal having an antiphase of the reset pulse voltage signal.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will now be described with reference to the accompanying drawings.

Figure 6:
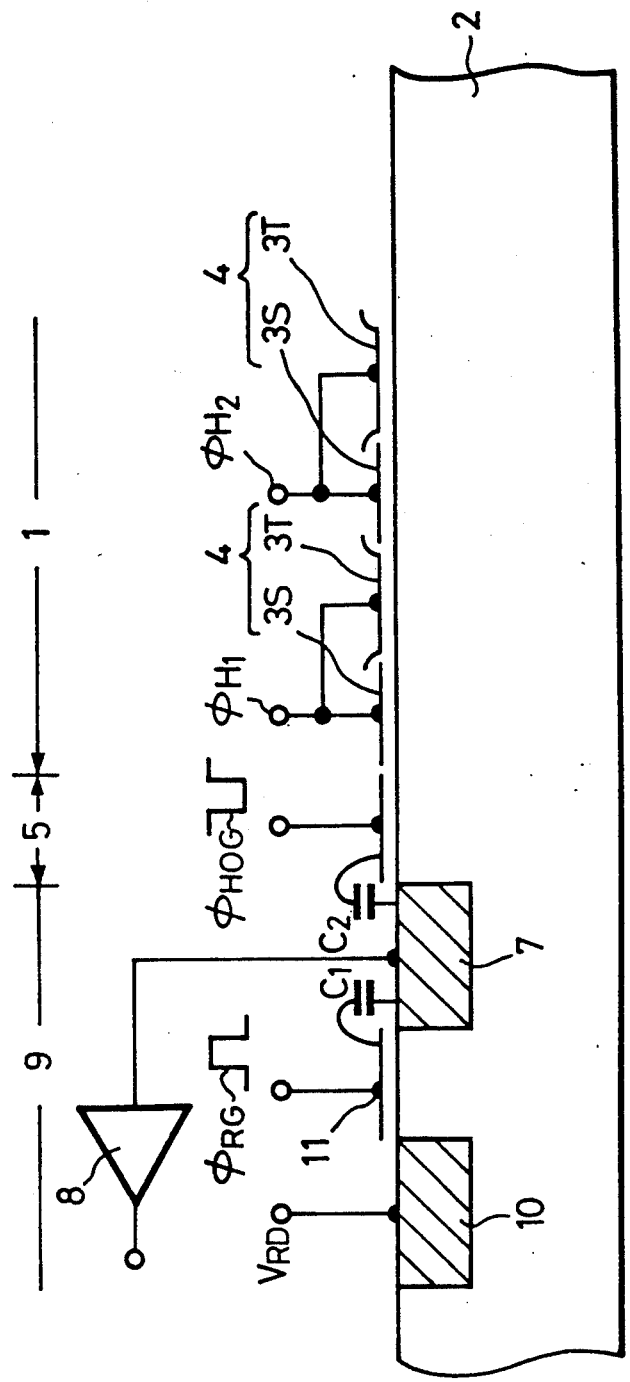
FIG. 6 is a fragmentary side view of a structure of a final stage of a horizontal transfer register and an output section of a CCD imaging device according to a first embodiment of the present invention.

FIG. 6 of the accompanying drawings show a structure of a final stage of a horizontal transfer register and an output section of a CCD imaging device according to a first embodiment of the present invention. In FIG. 6, elements and parts identical to those of FIG. 1 are marked with the same references and therefore need not be described in detail.

Figure 1:
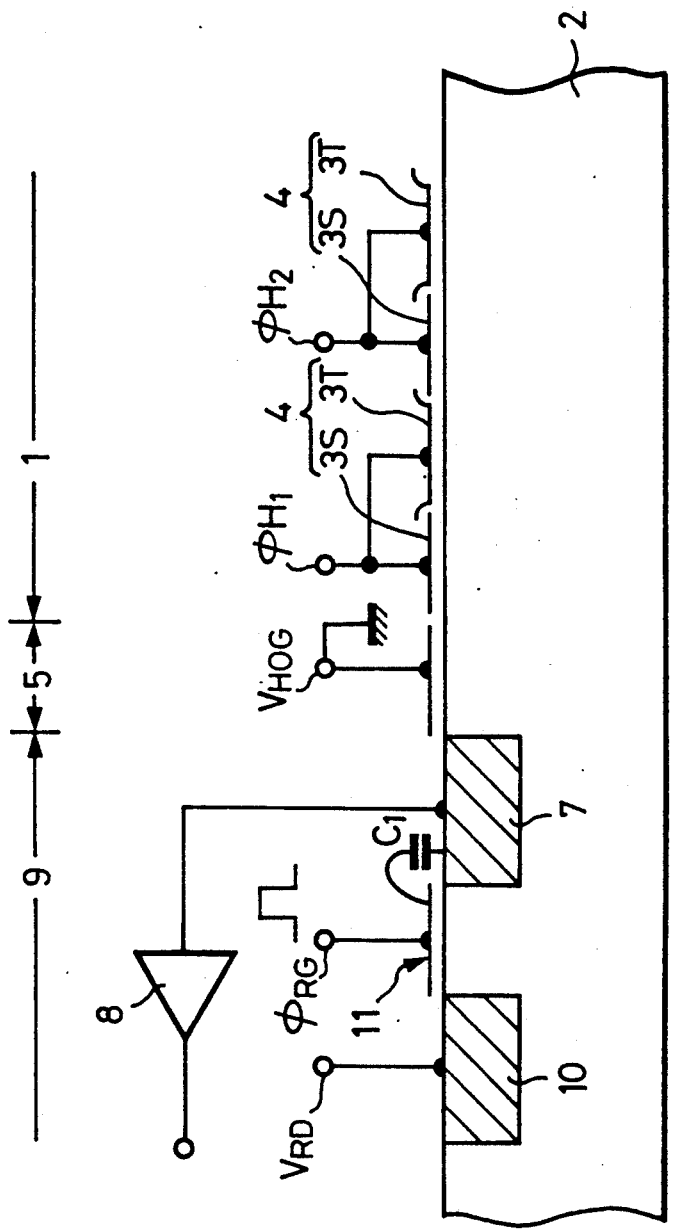
FIG. 1 is a fragmentary side view of a structure of a main portion of a CCD imaging device according to the prior art.
Figure 2:
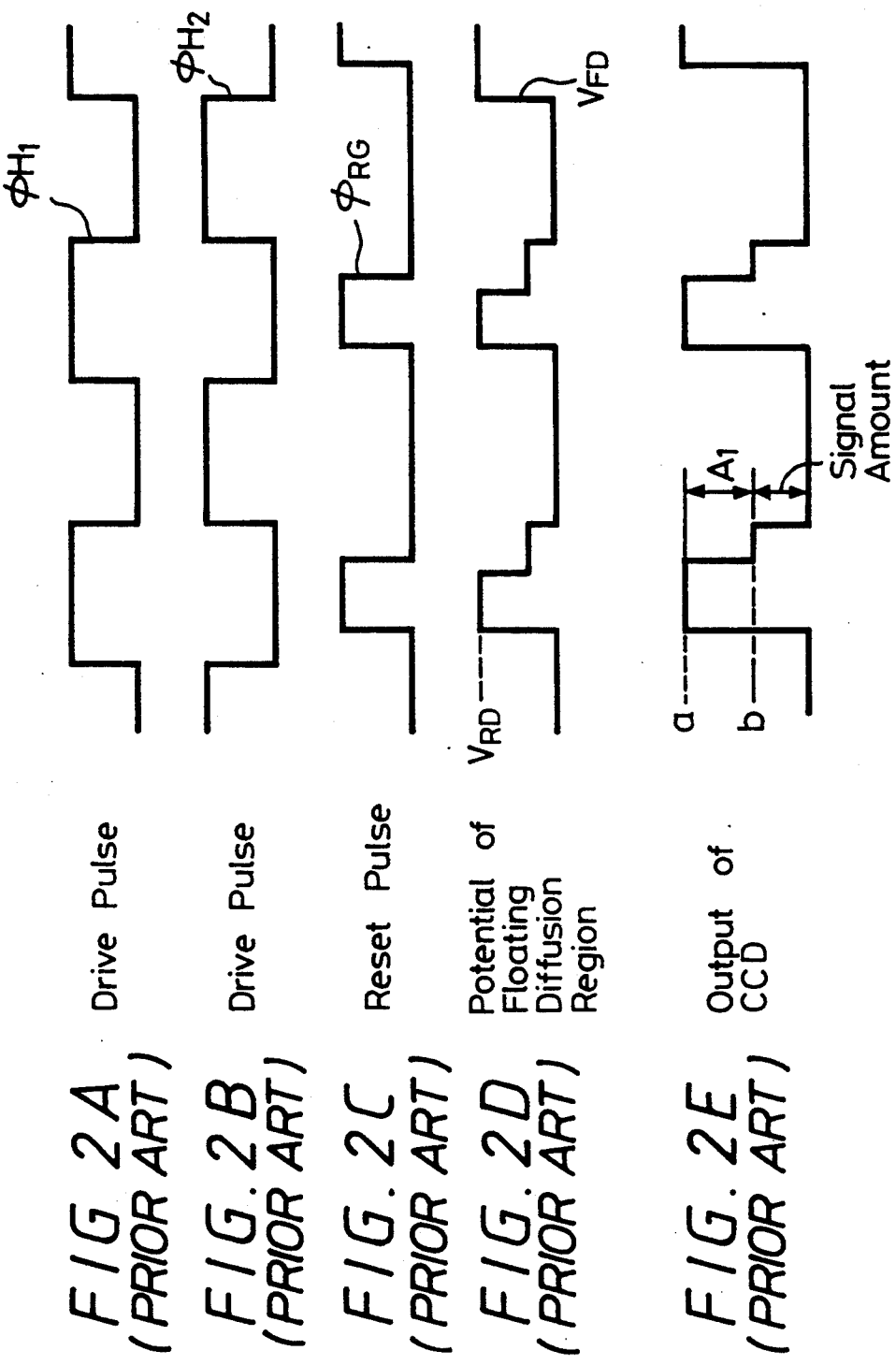
FIGS. 2A through 2E are respectively diagrams showing waveforms of pulses applied to the CCD imaging device and waveform of an output from the CCD imaging device according to the prior art.
Figure 3:
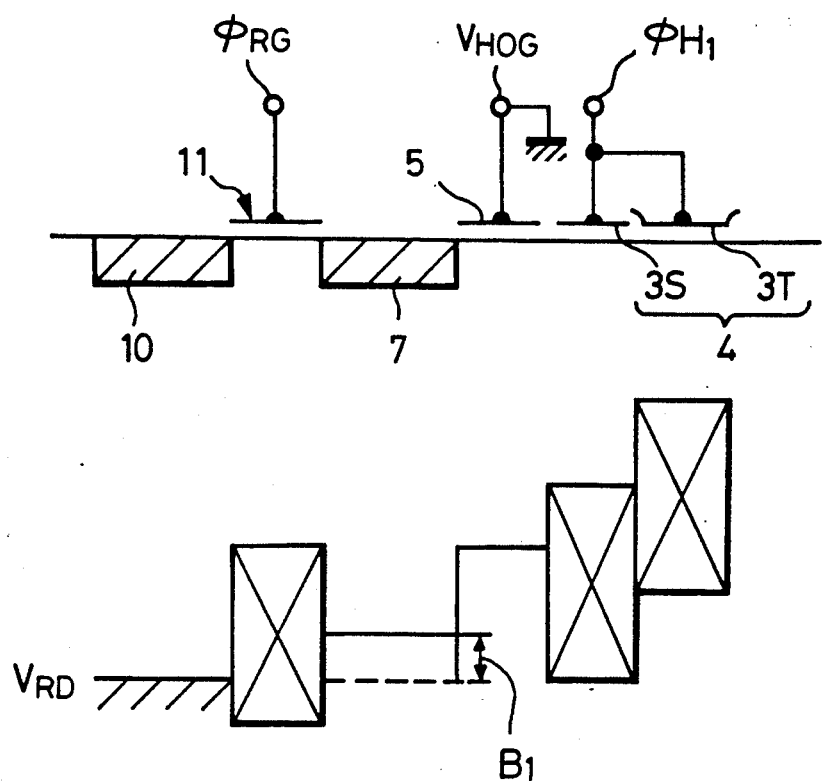
FIG. 3 is a diagram of potential developed in the output section according to the prior art.

According to the first embodiment of the present invention, similarly to FIG. 1, this CCD imaging device comprises a horizontal transfer register 1 of CCD structure each having an array of a plurality of transfer sections 4 each of which has a storage electrode 3S and a transfer electrode 3T formed on a major surface of a semiconductor substrate 2 via an insulating layer (not shown) to sequentially transfer signal charges in the horizontal direction by the two-phase drive pulses $\phi H_1$, $\phi H_2$, a horizontal output gate section 5 connected to the final transfer section 4 of the horizontal transfer register 1, a floating diffusion region 7, an output amplifier 8 connected to the floating diffusion region 7, a reset drain region 10 and a reset gate section 11 which discharges signal charges transferred to the floating diffusion region 7 to the reset drain region 10, as shown in FIG. 6. The predetermined voltage $V_{RD}$ is applied to the reset drain region 10 and the reset pulse $\phi RG$ is applied to the reset gate section 11, respectively.

Figure 7:
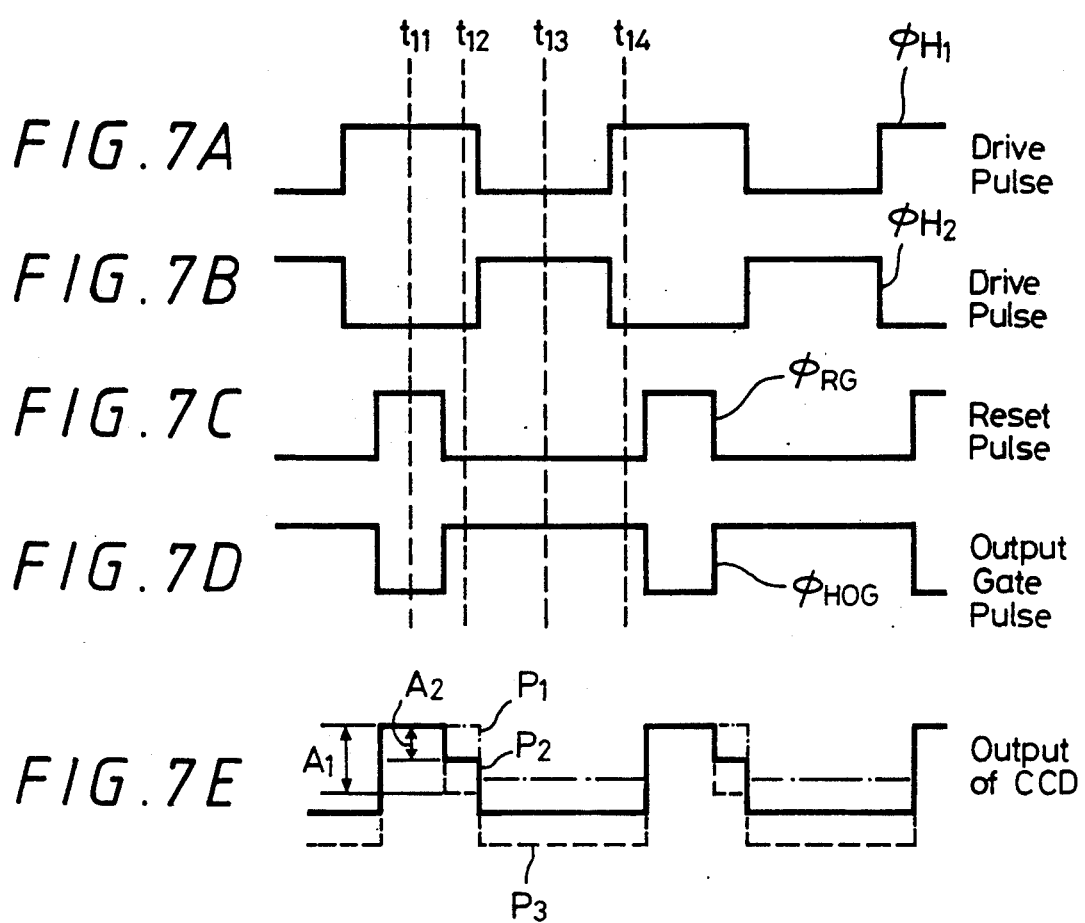
FIGS. 7A through 7E are respectively diagrams of waveforms of pulses applied and a waveform of a CCD output of the embodiment of the present invention shown in FIG. 6.

According to this embodiment, as shown in FIG. 6 and FIGS. 7A to 7B, an output gate pulse $\phi_{HOG}$ having an anti-phase of that of the reset pulse $\phi_{RG}$ is applied to the horizontal output gate section 5 instead of the conventional fixed potential.

Because the parasitic capacitance $C_1$ exists between the floating diffusion region 7 and the reset gate section 11 and a parasitic capacitance $C_2$ also exists between the floating diffusion region 7 and the horizontal output gate section 5, the output gate pulse $\phi_{HOG}$ having the anti-phase of that of the reset pulse $\phi RG$ is applied to the horizontal output gate section 5, thereby suppressing a potential from being lowered in the floating diffusion region 7 after the reset gate 11 is turned off. Hence, the coupling amount $A_2$ in the so-called CCD output waveform can be suppressed.

More specifically, when the reset gate section 11 is turned on by the application of the high level (e.g., 5 V) of the reset pulse $\phi RG$ thereto, a potential $V_{FD}$ of the floating diffusion region 7 becomes equal to a potential $V_{RD}$ of the reset drain region 10. At that time, the low level (e.g., 0 V) of the output gate pulse $\phi_{HOG}$ is applied to the horizontal output gate section 5. Then, although the potential $V_{FD}$ of the floating diffusion region 7 after the reset gate section 11 is turned off by the application of the low level (e.g., 0 V) of the reset pulse $\phi RG$ is lowered by the capacitive coupling of the parasitic capacitance $C_1$, the high level (e.g., 5 V) of the output gate pulse $\phi_{HOG}$ is simultaneously applied to the horizontal gate section 5 so that the potential of the floating diffusion region 7 is increased by the capacitive coupling of the parasitic capacitance $C_2$. Consequently, the potential in the floating diffusion region 7 after the reset gate section 11 is turned off can be suppressed from being lowered, which can reduce the coupling amount $A_2$ in the waveform of the CCD output shown in FIG. 7E.

If the parasitic capacitance $C_1$ and the parasitic capacitance $C_2$ are exactly the same value ($C_1 = C_2$) and the phase of the reset pulse $\phi RG$ and that of the output gate pulse $\phi_{HOG}$ are exactly opposite to each other, then the coupling amount in FIG. 7E is reduced to zero and a CCD output waveform $P_1$ is presented as shown by a broken line in FIG. 7E. Further, the coupling amount can be reduced if the parasitic capacitance $C_1$ and the parasitic capacitance $C_2$ are not equal. If an inequality of $C_1 > C_2$, for example, is satisfied, then a CCD output waveform $P_2$ shown by a solid line in the coupling amount $A_2$ in FIG. 7E is presented. In this case, an inequality of $C_1 > C_2$ might be satisfied. $P_3$ in FIG. 7E represents a conventional CCD output waveform obtained in FIG. 1 for comparison. While the amplitudes of the output gate pulse $\phi_{HOG}$ and the reset pulse $\phi RG$ are made equal as described above, the present invention is not limited thereto and the coupling amount $A_2$ can be suppressed more by changing the amplitude of the output gate pulse $\phi_{HOG}$.

Figure 8:
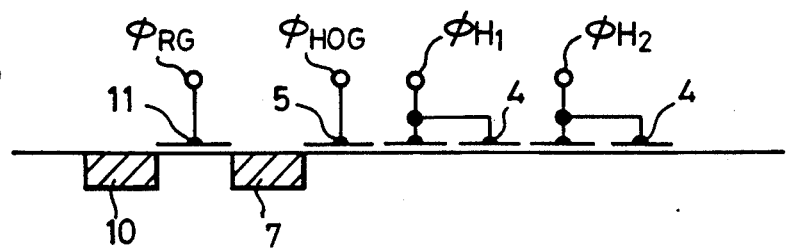
FIGS. 8A through 8D are respectively diagrams of potentials developed in the horizontal charge transfer section of the present invention shown in FIG. 8 and, to which references will be made in explaining charge transfer operation.

Transfer of signal charges according to the first embodiment of the present invention will be described with reference to applied pulse waveforms of FIGS. 7A to 7D and a diagram of potentials of FIG. 8.

The two-phase drive pulses $\phi H_1$ and $\phi H_2$ are applied to the transfer section 4 of the horizontal transfer register 1, the output gate pulse $\phi_{HOG}$ is applied to the horizontal output gate section 5 and the reset pulse $\phi RG$ is applied to the reset gate section 11 at timings shown in FIGS. 7A through 7D, respectively.

Figure 8A:
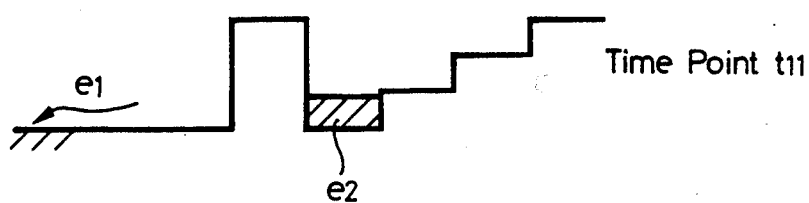

At timing point $t_{11}$ in which the reset gate section 11 is turned on, potentials in the respective sections are set in the states shown in FIG. 8A, whereby a signal charge $e_1$ in the floating diffusion region 7 is discharged to the reset drain region 10 and the next signal charge $e_2$ is transferred to the portion beneath the storage electrode 3S of the final transfer section 4.

Figure 8B:
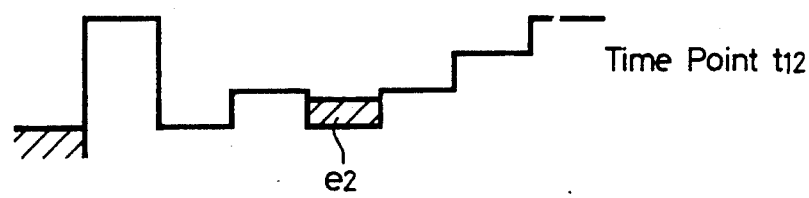

At timing point $t_{12}$ at which the reset gate section 11 is turned off, the drive pulse $\phi H_1$ is high in level and the output gate pulse $\phi_{HOG}$ goes to high level so that the potential state shown in FIG. 8B is presented. Thus, the signal charge $e_2$ remains in the portion beneath the storage electrode 3S of the final transfer section 4.

Figure 8C:
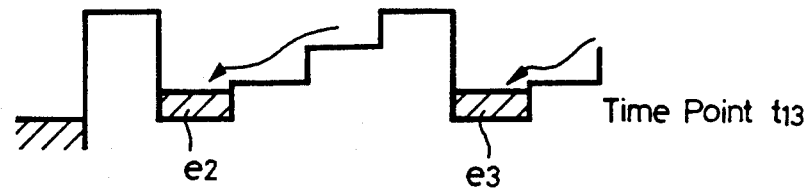

In the next timing point $t_{13}$, the drive pulse $\phi H_1$ goes to low level, bringing about the potential state shown in FIG. 8C. Then, the signal charge $e_2$ of the transfer section 4 is transferred to the floating diffusion region 7 and the signal component is output from the output amplifier 8.

Figure 8D:
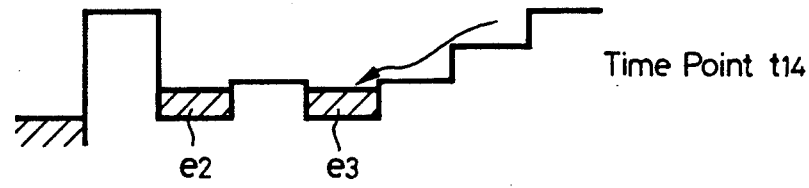

In the next timing point $t_{14}$, the drive pulse $\phi H_1$ goes to high level, thereby presenting the potential state shown in FIG. 8D. Therefore, the next signal charge $e_3$ is transferred to the portion beneath the storage electrode 3S of the final transfer section 4. In this fashion, signal charges are sequentially transferred to the floating diffusion region 7 and then output from the output amplifier 8.

According to the above first embodiment, the output gate pulse $\phi_{HOG}$ having an anti-phase of the reset pulse $\phi RG$ is applied to the succeeding horizontal output gate section 5 of the horizontal transfer register 1, whereby the influence of the parasitic capacitance $C_1$ between the reset gate section 1 and the floating diffusion region 7 can be reduced and the coupling can be reduced. Consequently, the amount of charges processed by the floating diffusion region 7 can be avoided from being reduced by the coupling amount increased by the increase of sensitivity of the CCD imaging devices such as CCD area sensor, CCD linear sensor or the like. Also, the amount of charges transferred to the floating diffusion region 7 can be avoided from being reduced.

According to the first embodiment of the present invention, the influence of the parasitic capacitance between the floating diffusion region and the reset gate section can be suppressed and the coupling amount between the reference potential and the field-through potential in the output can be reduced, thereby keeping sufficient amount of charges processed by the floating diffusion region. Therefore, the sensitivity of the CCD imaging devices such as CCD area sensor, CCD linear sensor or the like can be improved.

Figure 4:
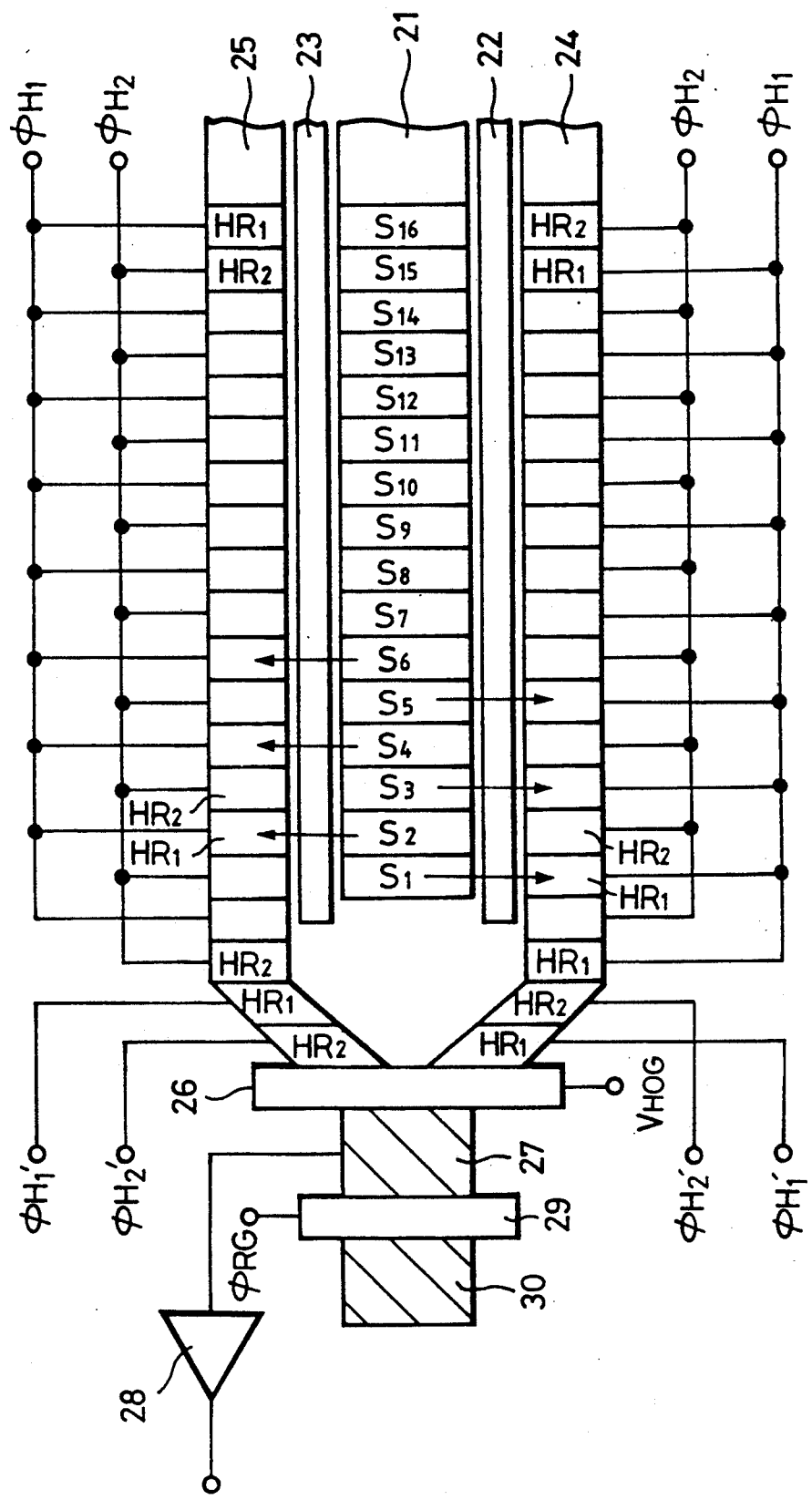
FIG. 4 is a fragmentary plan view of a structure of a CCD linear sensor according to the prior art.
Figure 5A:
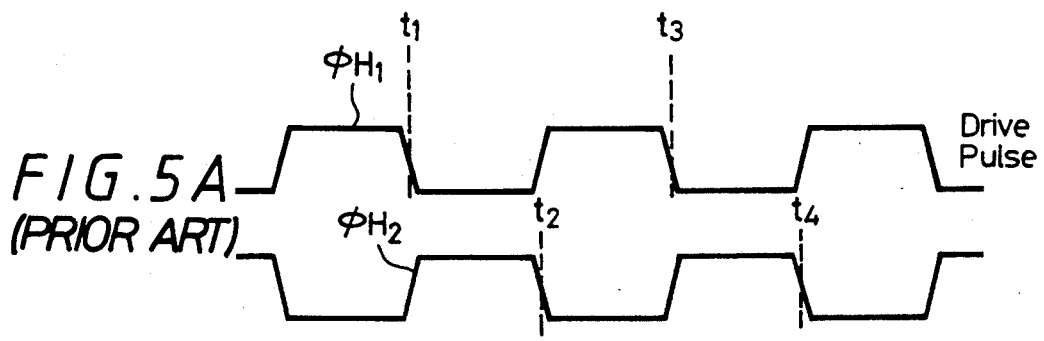
FIGS. 5A through 5E are respectively diagrams of waveforms of pulses supplied, a waveform of a CCD output or the like according to the prior-art CCD linear sensor.
Figure 5B:
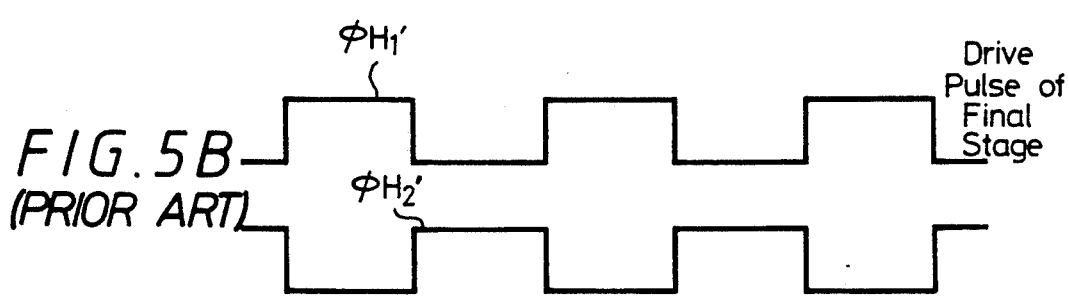
Figure 5C:
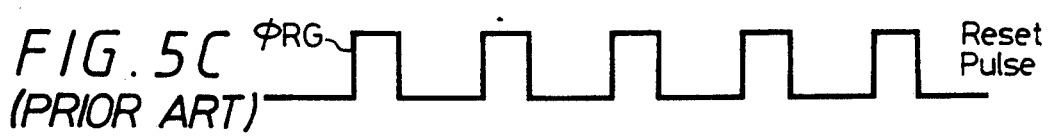
Figure 5D:
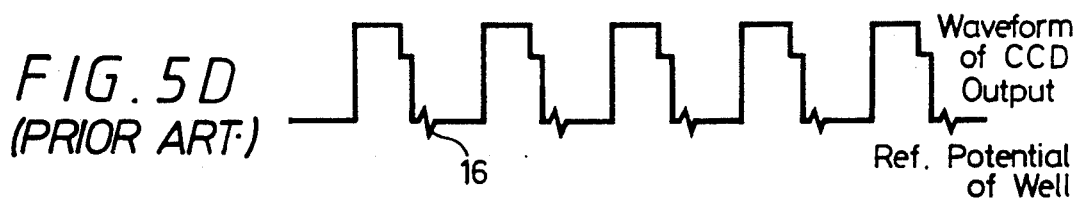
Figure 5E:
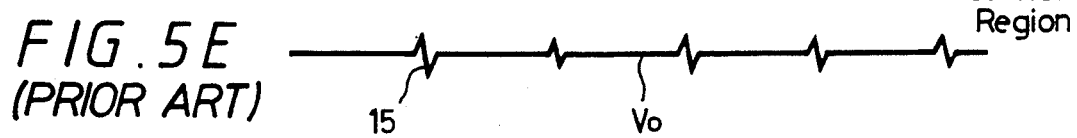
Figure 9:
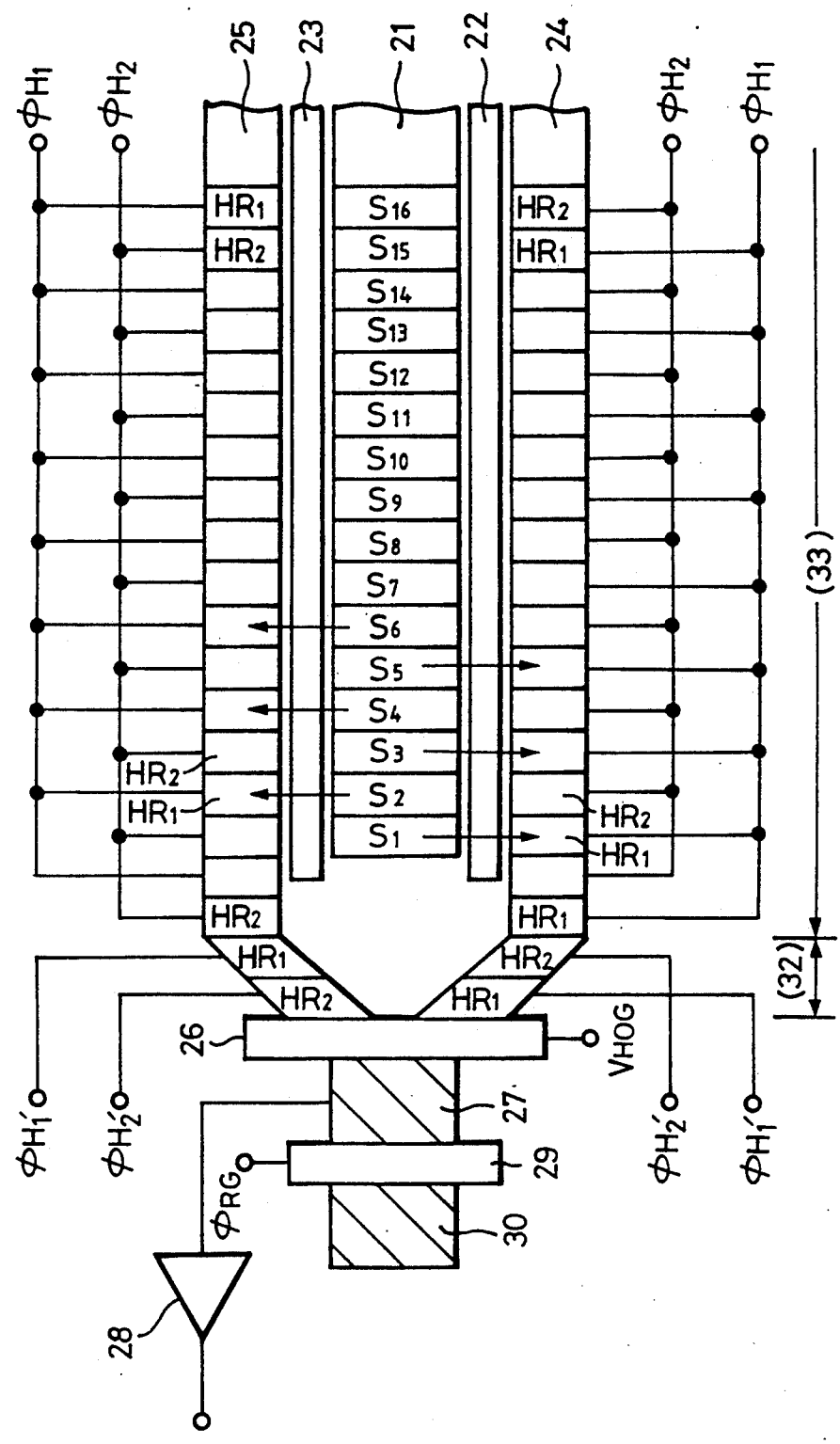
FIG. 9 is a fragmentary plan view of a structure of a CCD imaging device according to a second embodiment of the present invention.
Figure 10A:
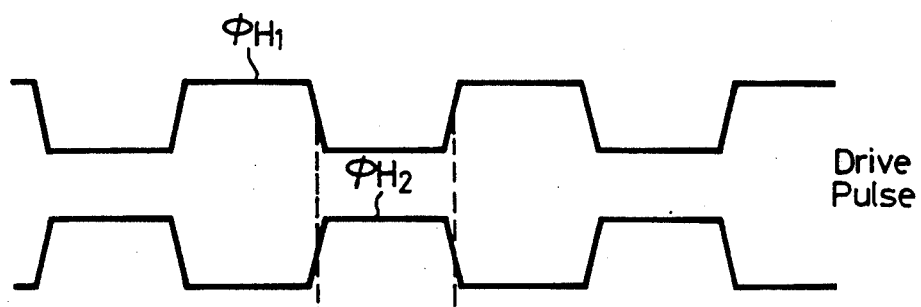
FIGS. 10A through 10E are respectively diagrams of waveforms of drive pulses, a reset pulse and a CCD output according to the second embodiment of the present invention.
Figure 10B:
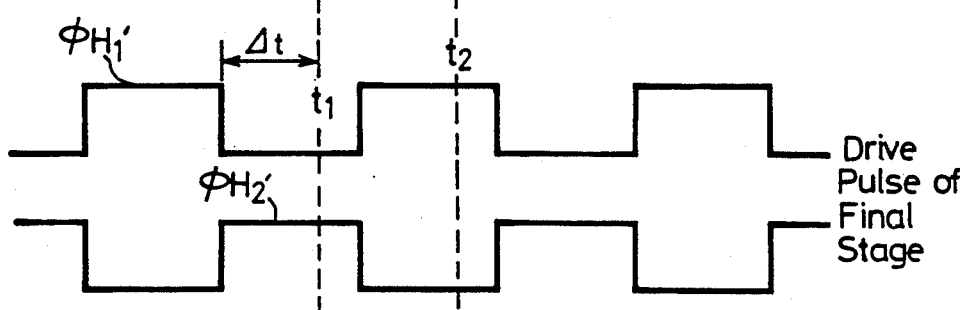
Figure 10C:
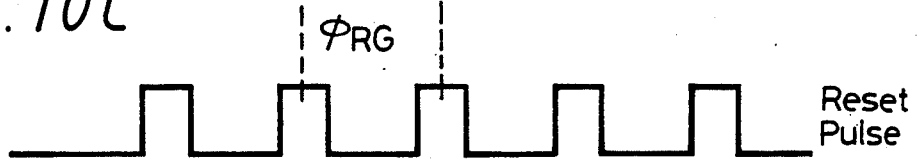
Figure 10D:
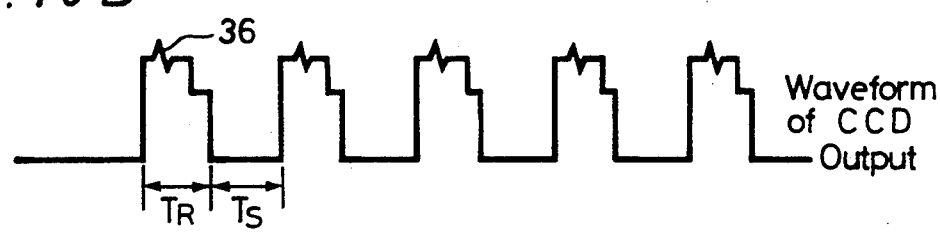
Figure 10E:
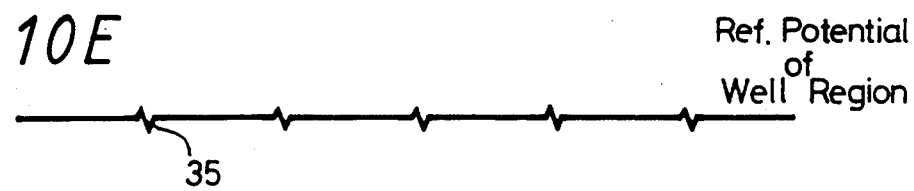

A CCD imaging device according to a second embodiment of the present invention will be described below in detail with reference to FIG. 9 through FIGS. 10A to 10E. Also in the second embodiment, the CCD imaging device is applied to the CCD linear sensor. In FIG. 9, like parts corresponding to those of FIG. 4 are marked with the same references and therefore need not be described in detail.

FIG. 9 of the accompanying drawings shows a fragmentary plan view of a structure of the CCD imaging device according to the second embodiment of the present invention.

As shown in FIG. 9, a photo sensing region 21 has an array of a plurality of photo sensing elements S ($S_1$, $S_2$, $S_3$ . . . ) arranged in one direction, and first and second horizontal transfer registers 24 and 25 of CCD structure are disposed on both sides of the photo sensing region 21 through read-out gate sections 22, 23 in parallel to the photo sensing region 21. Each of the first and second horizontal transfer registers 24 and 25 has an array of a plurality of transfer sections HR ($HR_1$, $HR_2$) each having a transfer electrode composed of a set of storage electrode and transfer electrode, though not shown. One drive pulse $\phi H_1$ of the two-phase drive pulses is applied to the transfer electrode of every other one first transfer section $HR_1$ and the other drive pulse $\phi H_2$ is applied to the transfer electrode of remaining every other one second transfer section $HR_2$. The first transfer sections $HR_1$ of the first horizontal transfer register 24 are formed in association with the odd-numbered photo sensing elements $S_1, S_3, S_5, \ldots$, for example, and the first transfer sections $HR_1$ of the second horizontal transfer register 25 are formed in association with the even-numbered photo sensing elements $S_2, S_4, S_6, \ldots$, for example. Final terminals of the first and second horizontal transfer registers 24 and 25 are connected to a common detecting section, i.e., floating diffusion region 27 through a common horizontal output gate section 26 to which the gate voltage $V_{HOG}$ is applied. An output amplifier 28 is connected to the diffusion floating region 27. A reset gate section 29 to which the reset pulse $\phi RG$ is applied is formed between the floating diffusion region 27 and a reset drain region 30.

According to this CCD linear sensor, similarly as described above, signal charges of the odd-numbered photo sensing elements $S_1 S_3, S_5, \ldots$, read out to the first horizontal transfer register 24 and signal charges of the even-numbered photo sensing elements $S_2, S_4, S_6, \ldots$, are read out to the second horizontal transfer register 25. Then, the signal charges thus read out are transferred through the first and second horizontal transfer registers 24, 25 in one direction and mixed together by the floating diffusion region 27 through a horizontal output gate section 26, i.e., odd-numbered and even-numbered signal charges are alternately transferred to the floating diffusion region 27. Then, the signal charges are converted by the floating diffusion region 27 in the form of charge to voltage and signals corresponding to the odd-numbered and even-numbered pixels are alternately output through an output amplifier 28.

According to the second embodiment of the present invention, the final transfer section of the first and second horizontal transfer registers 24, 25, e.g., a transfer region 32 of final bit or a plurality of bits including the final bit is separated from the first and second horizontal transfer registers 24 and 25. Then, a drive pulse $\phi H_1'$ (see FIG. 10B) is applied to the first transfer section $HR_1$ of the final transfer region 32 and a drive pulse $\phi H_2'$ (see FIG. 10B) is applied to the second transfer section $HR_2$, respectively. Further, a drive pules $\phi H_1$ (see FIG. 10A) is applied to the first transfer sections $HR_1$ of a transfer region 33 which precedes the final stage portion of the first and second horizontal transfer registers 24, 25 and a drive pulse $\phi H_2$ (see FIG. 10A) is applied to the second transfer sections $HR_2$ in the transfer region 33, respectively. The reset pulse $\phi RG$ (see FIG. 10) having frequency twice those of the drive pulses $\phi H_1, \phi H_1', \phi H_2, \phi H_2'$ is supplied to the reset gate section 29 similarly as described before. When the transfer region 33 having large capacitance is driven, the phases of the drive pulses $\phi H_1, \phi H_2$ applied to the preceding transfer region 33 are shifted by 't from those of the drive pulses $\phi H_1', \phi H_2'$ such that negative-going edge $t_1$ or $t_2, \ldots$ of the drive pulse $\phi H1$ or $\phi H2$ which transfers signal charges to the succeeding transfer section $HR$ fall within the high level period of the reset pulse $\phi RG$ (so-called ON period of the reset gate section 29).

According to the above structure, since the phases of the drive pulse $\phi H_1, \phi H_2$ applied to the preceding transfer region 33 are shifted by $\Delta t$ from those of the drive pulses $\phi H_1', \phi H_2'$ applied to the final transfer region 32 so that the negative-going edges of the drive pulses $\phi H_1, \phi H_2$ which transfer signal charges to the next stage fall within the high level period of the reset pulse $\phi RG$ (so-called ON period of the reset gate section 29), a noise component 36 based on a fluctuated component 35 (see FIG. 10E) of the reference potential Vo of the well region is superimposed upon an output waveform in an ON period $T_R$ of the reset gate section 29 and can be prevented from being superimposed upon an output waveform, i.e., signal waveform of a signal period $T_S$. Therefore, the output waveform in the signal period $T_S$ can be made flat. Further, a difference between the signal level of the odd-numbered pixel and that of the even-numbered signal level can be eliminated and the image quality of high resolution can be obtained without correcting a black signal of each pixel.

An example of a circuit configuration which can shift phases between the above-mentioned drive pulses $\phi H_1'$, $\phi H_2'$ and $\phi H_1', \phi H_2$ will be described in greater detail with reference to FIG. 11.

Figure 11:
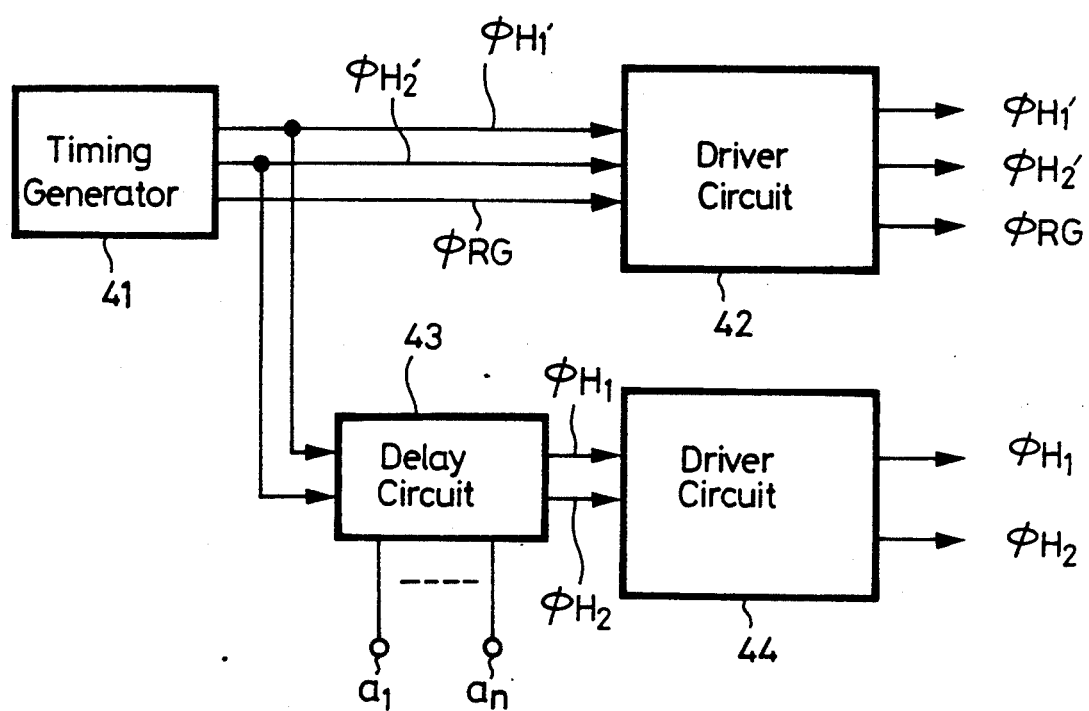
FIG. 11 is a block diagram showing a circuit configuration which generates pulses to be supplied according to the second embodiment of the present invention.

In the case of the CCD linear sensor whose timing system is formed as an IC-chip, as shown in FIG. 11 of the accompanying drawings, the clock pulses $\phi H1'$, $\phi H2'$ for final stage and the reset pulse $\phi RG$ generated from a timing generator 41 are supplied to a driver circuit 42 as is. Also, a delay circuit 43 is connected to external control terminals $a_1$ to $a_n$ and the delay circuit 43 delays the clock pulses $\phi H_1', \phi H_2'$ from the timing generator 41 to provide clock pulses $\phi H_1, \phi H_2$ which are phase-shifted by $\Delta t$ from the clock pulse $\phi H_1', \phi H_2'$. These clock pulses $\phi H_1, \phi H_2$ are supplied to a driver circuit 44. Since the delay amount $\Delta t$ of the delay circuit 43 is changed with available frequencies, the delay amount $\Delta t$ can be changed by switching voltages applied to the external control terminals $a_1$ to $a_n$ in a digital fashion. The phases between the drive pulses $\phi H_1'$, $\phi H_2'$ and drive pulses $\phi H_1, \phi H_2$ are shifted as described above, whereby the influence of the transfer capacitance in the transfer region 33 in the CCD linear sensor can be reduced and the output waveform in the signal period can be made flat. Also, a difference of signal levels between the pixels can be improved.

While the signal charges of the first and second horizontal transfer register 24, 25 are alternately transferred to and mixed together by the floating diffusion region 27 as described above, the present invention is not limited thereto and the following variant is also possible. That is, a transfer section of several bits which are driven by two-phase drive pulses is disposed at the front stage of the floating diffusion region 27, whereby signal charges from the first and second horizontal transfer registers 24, 25 are alternately transferred to this transfer section of several bits and mixed together. In this case, before the odd-numbered and even-numbered signal charges are added by the above transfer section, the final transfer region 32 of a plurality of bits in the first and second horizontal transfer registers 24, 25 is separated from the preceding transfer region 33 and supplied with the drive pulses $\phi H_1', \phi H_2'$ and $\phi H_1, \phi H_2$ in the above-mentioned phase-relation.

Furthermore, while the present invention is applied to the CCD linear sensor having the first and second horizontal transfer registers 24, 25 as described above, the present invention is not limited thereto and the present invention can be applied to a CCD area image sensor in which signal charges of one line are read out by a plurality of horizontal transfer registers.

According to the CCD imaging device of the present invention, the output waveform in the signal period can be made flat and a difference between the pixels, i.e., the signal level corresponding to the odd-numbered pixel and the signal level corresponding to the even-numbered pixel can be improved. Thus, the image quality of high resolution can be obtained without correcting the black signal.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A charge transfer device formed on a semiconductor substrate comprising:
   a charge detecting section including an electrically floating diffusion region;
   a floating diffusion amplifier connected to said floating diffusion region, and a transistor responsive to a reset pulse voltage signal for resetting said floating diffusion region to a predetermined potential, said transistor comprising said floating diffusion region, a drain diffusion region formed in said substrate, a gate electrode connected to a source of said pule voltage signal, and a channel formed on said substrate, said channel extending between said floating diffusion region and said drain diffusion region; and
   a charge transfer means for transferring charges to said charge detecting section, said charge transfer means including a channel formed on said substrate, a plurality of gate electrodes insulated from said channel, and an output gate electrode formed on an end of said charge transfer means, said plurality of gate electrodes being responsive to a driving pulse voltage signal, wherein said driving pulse voltage signal having a specific phase so that a noise generated by a voltage shift of said driving pulse voltage signal overlaps on an output signal corresponding to a reset period.

2. The charge transfer device according to claim 1, wherein said transistor is active in a voltage shift period of said driving pulse voltage signal.

3. The charge transfer device according to claim 1, wherein said reset pulse voltage signal is high in level in a voltage shift period of said driving pulse voltage signal.

4. A solid state linear imaging device formed on a semiconductor substrate comprising:
   a plurality of photo sensing elements receiving a light and producing a charge signal corresponding to the amount of light; and
   charge transfer means for receiving said charge signal from said photo sensing elements and transferring said charge signal to a charge detecting section, said charge detecting section including an electrically floating diffusion region, a floating diffusion amplifier connected to said floating diffusion region, and a transistor responsive to a reset pulse voltage signal for resetting said floating diffusion region to a predetermined potential, said transistor comprising said floating diffusion region, a drain diffusion region formed in said substrate, a gate electrode connected to a source of said pulse voltage signal, and a channel formed on said substrate, said channel extending between said floating diffusion region and said drain diffusion region, said charge transfer means including a channel formed on said substrate, a plurality of gate electrodes insulated from said channel, and an output gate electrode formed on an end of said charge transfer means, said plurality of gate electrodes being responsive to a driving pulse voltage signal, and said driving pulse voltage signal having a specific phase so that a noise generated by a voltage shift of said driving pulse voltage signal overlaps on an output signal corresponding to a reset period.

5. The solid state linear imaging device according to claim 4, wherein said transistor is active in a voltage shift period of said driving pulse voltage signal.

6. The solid state linear imaging device according to claim 4, wherein said reset pulse voltage signal is high in level in a voltage shift period of said driving pulse voltage signal.

7. A charge transfer device formed on a semiconductor body comprising:
   a charge detecting section including an electrically floating diffusion region, a floating diffusion amplifier connected to said floating diffusion region and a transistor responsive to a reset pulse voltage signal for resetting said floating diffusion region to a predetermined potential, said transistor comprising said floating diffusion region, a drain diffusion region formed in a substrate, a gate electrode connected to a source of said reset pulse voltage signal, and a channel formed on said substrate, said channel extending between said floating diffusion region and said drain diffusion region; and
   charge transfer means for transferring charges to a charge detecting section, said charge transfer means including a channel formed on said substrate, a plurality of gate electrodes insulated from said channel, and an output gate electrode formed on an end of said charge transfer means, said gate electrodes consisting of a first portion responsive to a first driving pulse voltage signal and a second portion responsive to a second driving pulse voltage signal, said second portion being adjacent to said output gate electrode, wherein said first driving pulse voltage signal has a specific phase so that a noise generated by a voltage shift of said first driving pulse voltage signal overlaps on an output signal corresponding to a reset period.

8. The charge transfer device according to claim 7, wherein said transistor is active in a voltage shift period of said first driving pulse voltage signal.

9. The charge transfer device according to claim 7, wherein said reset pulse voltage signal is high in level in a voltage shift period of said first driving pulse voltage signal.

10. The charge transfer device according to claim 7, wherein said second driving pulse voltage signal has a phase different from that of said first driving pulse voltage signal.

11. A solid state linear imaging device formed on a semiconductor substrate comprising:
    a plurality of photo sensing elements receiving a light and producing a charge signal corresponding to the amount of light; and
    charge transfer means for receiving said charge signal from said photo sensing elements and transferring said charge signal to a charge detecting section, said charge detecting section including an electrically floating diffusion region, a floating diffusion amplifier connected to said floating diffusion region, and a transistor responsive to a reset pulse voltage signal for resetting said floating diffusion region to a predetermined potential, said transistor comprising said floating diffusion region, a drain diffusion region formed in said substrate, a gate electrode connected to a source of said reset pulse voltage signal, and a channel formed on said substrate, said channel extending between said floating diffusion region and said drain diffusion region, said charge transfer means including a channel formed on said substrate, a plurality of gate electrodes insulated from said channel, and an output gate electrode formed on an end of said charge transfer means, said gate electrodes consisting of a first portion responsive to a first driving pulse voltage signal and a second portion responsive to a second driving pulse voltage signal, said second portion being adjacent to said output gate electrode, wherein said first driving pulse voltage signal has a specific phase so that a noise generated by a voltage shift of said first driving pulse voltage signal overlaps on an output signal corresponding to a reset period.

12. The solid state linear imaging device according to claim 11, wherein said transistor is active in a voltage shift period of said first driving pulse voltage signal.

13. The solid state linear imaging device according to claim 11, wherein said reset pulse voltage signal is high in level in a voltage shift period of said first driving pulse voltage signal.

14. The solid state linear imaging device according to claim 11, wherein said second driving pulse voltage signal has a phase different from that of said first driving pulse voltage signal.

15. A charge transfer device formed on a semiconductor body comprising:

a charge detecting section including an electrically floating diffusion region, a floating diffusion amplifier connected to said floating diffusion region and a transistor responsive to a reset pulse voltage signal for resetting said floating diffusion region to a predetermined potential, said transistor comprising said floating diffusion region, a drain diffusion region formed in a substrate, a gate electrode connected to a source of said pulse voltage signal, and a channel formed on said substrate, said channel extending between said floating diffusion region and said drain diffusion region; and charge transfer means for transferring charges to a charge detecting section, said charge transfer means including a channel formed on said substrate, a plurality of gate electrodes insulated from said channel, and an output gate electrode formed on an end of said charge transfer means, said output gate electrode being responsive to an output gate pulse voltage signal, and said output gate pulse voltage signal having an anti-phase of said reset pulse voltage signal.

* * * * *